United States Patent
Kurokawa et al.

(10) Patent No.: US 8,633,051 B2
(45) Date of Patent: Jan. 21, 2014

(54) SEMICONDUCTOR DEVICE AND METHOD FOR MANUFACTURING SEMICONDUCTOR DEVICE

(75) Inventors: Yoshiyuki Kurokawa, Kanagawa (JP); Takayuki Ikeda, Kanagawa (JP); Munehiro Kozuma, Kanagawa (JP); Hikaru Tamura, Kanagawa (JP); Kazuko Yamawaki, Kanagawa (JP); Takashi Hamada, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 675 days.

(21) Appl. No.: 12/859,446

(22) Filed: Aug. 19, 2010

(65) Prior Publication Data

US 2011/0042768 A1    Feb. 24, 2011

(51) Int. Cl.
*H01L 31/0232* (2006.01)
*H01L 21/71* (2006.01)

(52) U.S. Cl.
USPC ............. 438/69; 438/57; 438/64; 438/66; 438/73; 257/431; 257/432; 257/433; 257/434; 257/443; 257/447; 257/E31.127; 257/E31.117; 257/E21.536

(58) Field of Classification Search
None
See application file for complete search history.

(56) References Cited

U.S. PATENT DOCUMENTS

| | | | | |
|---|---|---|---|---|
| 6,358,759 B1 * | 3/2002 | Hirabayashi | | 438/7 |
| 7,279,673 B2 * | 10/2007 | Kimura | | 250/208.2 |
| 7,280,280 B2 * | 10/2007 | Boettiger et al. | | 359/619 |
| 7,352,511 B2 | 4/2008 | Boettiger et al. | | |

FOREIGN PATENT DOCUMENTS

| | | |
|---|---|---|
| JP | 10-333605 | 12/1998 |
| JP | 2001-320547 | 11/2001 |
| JP | 2005-10690 | 1/2005 |

* cited by examiner

*Primary Examiner* — Hrayr A Sayadian
(74) *Attorney, Agent, or Firm* — Husch Blackwell LLP

(57) ABSTRACT

An object is to prevent a reduction of definition (or resolution) (a peripheral blur) caused when reflected light enters a photoelectric conversion element arranged at a periphery of a photoelectric conversion element arranged at a predetermined address. A semiconductor device is manufactured through the steps of: forming a structure having a first light-transmitting substrate, a plurality of photoelectric conversion elements over the first light-transmitting substrate, a second light-transmitting substrate provided so as to face the plurality of photoelectric conversion elements, a sealant arranged so as to bond the first light-transmitting substrate and the second light-transmitting substrate and surround the plurality of photoelectric conversion elements; and thinning the first light-transmitting substrate by wet etching.

18 Claims, 16 Drawing Sheets

8000

8000

SEMICONDUCTOR DEVICE AND METHOD FOR MANUFACTURING SEMICONDUCTOR DEVICE

BACKGROUND OF THE INVENTION

1. Field of the Invention

The technical field of the present invention relates to a semiconductor device and the like provided with a photoelectric conversion element.

2. Description of the Related Art

A contact image sensor provided with a photoelectric conversion element (an optical sensor) is disclosed in Patent Document 1.

A display device having a display element and a photoelectric conversion element (an optical sensor) and being provided with an image sensor function is disclosed in Patent Document 2.

Note that the contact image sensor, the display device, and the like are semiconductor devices since a semiconductor is used.

REFERENCES

[Patent Document 1] Japanese Published Patent Application No. 2001-320547
[Patent Document 2] Japanese Published Patent Application No. H10-333605

SUMMARY OF THE INVENTION

In a semiconductor device in which a plurality of photoelectric conversion elements are arranged, it is preferable that light, which is reflected at a predetermined position of an object to be read, enters a photoelectric conversion element provided at a predetermined address.

In other words, when light which is reflected at a predetermined position enters both a photoelectric conversion element arranged at a predetermined address and a photoelectric conversion element arranged at a next address thereof, definition (resolution) of an image sensor is reduced.

Thus, a reduction of definition (resolution) caused when reflected light enters a photoelectric conversion element arranged at a periphery of a photoelectric conversion element arranged at a predetermined address is called a peripheral blur.

In view of the foregoing, structures to prevent the peripheral blur will be disclosed below.

In the case where photoelectric conversion elements are provided over a light-transmitting substrate, light enters the photoelectric conversion elements through the light-transmitting substrate.

Here, in the case where the light-transmitting substrate is thick, reflected light having a vector in an oblique direction to a horizontal direction to a surface of the light-transmitting substrate deviates greatly in the horizontal direction of the surface of the light-transmitting substrate; therefore, the reflected light easily reaches the photoelectric conversion element arranged at the periphery of the predetermined address.

Therefore, smaller thickness of the light-transmitting substrate makes it possible to prevent the peripheral blur.

However, if the thickness of the light-transmitting substrate is too thin, the light-transmitting substrate is more likely to be broken in the process of manufacturing photoelectric conversion elements over the light-transmitting substrate.

Then, after the photoelectric conversion elements are formed over the light-transmitting substrate, the thickness of the light-transmitting substrate is reduced, whereby the light-transmitting substrate can be prevented from being broken in the process of manufacturing the photoelectric conversion elements over the light-transmitting substrate. In addition, since only one of a pair of light-transmitting substrates is etched, mechanical strength of the whole device can be maintained even after the etching.

It is preferable that after forming photoelectric conversion elements over a first light-transmitting substrate and sealing the photoelectric conversion elements with a second light-transmitting substrate which is face the photoelectric conversion elements, the first light-transmitting substrate be etched.

As an etching method, mechanical polishing, chemical mechanical polishing (CMP), wet etching, or the like can be used.

Note that in the case where polishing methods such as mechanical polishing and CMP are used, a substrate is damaged mechanically while polishing, whereby the substrate is broken or the strength of the substrate is reduced in some cases.

Therefore, wet etching by which the substrate is not damaged mechanically is preferably used.

In addition, as another method for reducing the peripheral blur, a plano-convex lens is used.

As illustrated in FIG. 12, one surface of the plano-convex lens is convex and the other surface thereof is plane.

When light which is emitted from a point light source and spreads enters from the plane surface of the plano-convex lens, the light is emitted parallel to each other from the convex surface of the plano-convex lens.

Therefore, by entering the plano-convex lens, light which enters the plane surface of the plano-convex lens in an oblique direction is refracted and travels straight, whereby the peripheral blur can be reduced.

In addition, when the plano-convex lens is provided between the object to be read and the light-transmitting substrate, a part of or all of light in an oblique direction is refracted by the plano-convex lens and travels straight before light enters the light-transmitting substrate.

That is it is a feature of the present invention to provide a manufacturing method of a semiconductor device including the steps of: forming a structure having a first light-transmitting substrate, a plurality of photoelectric conversion elements over the first light-transmitting substrate, a second light-transmitting substrate provided so as to face the plurality of photoelectric conversion elements, a sealant arranged so as to bond the first light-transmitting substrate and the second light-transmitting substrate and surround the plurality of photoelectric conversion elements; and thinning the first light-transmitting substrate by wet etching.

In addition, it is another feature of the present invention to provide a manufacturing method of a semiconductor device including the steps of: forming a structure having a first light-transmitting substrate, a plurality of photoelectric conversion elements over the first light-transmitting substrate, a second light-transmitting substrate provided so as to face the plurality of photoelectric conversion elements, a sealant arranged so as to bond the first light-transmitting substrate and the second light-transmitting substrate and surround the plurality of photoelectric conversion elements; thinning the first light-transmitting substrate and forming a depressed portion at a bottom of the light-transmitting substrate by wet etching; and providing a plano-convex lens at the depressed portion.

Further, it is preferable that the plano-convex lens be formed by filling the depressed portion with a resin.

Moreover, it is preferable that the plano-convex lens be provided by being inset in the depressed portion.

In addition, it is another feature of the present invention to provide a manufacturing method of a semiconductor device including the steps of: forming a structure having a first light-transmitting substrate, a plurality of photoelectric conversion elements over the first light-transmitting substrate, a second light-transmitting substrate provided so as to face the plurality of photoelectric conversion elements, a sealant arranged so as to bond the first light-transmitting substrate and the second light-transmitting substrate and surround the plurality of photoelectric conversion elements; thinning the first light-transmitting substrate and forming a plurality of depressed portions at a bottom of the light-transmitting substrate by wet etching; and providing a plurality of plano-convex lenses so as to correspond to the plurality of depressed portions, respectively.

Further, it is preferable that the plurality of plano-convex lenses be formed by filling the plurality of depressed portions with a resin.

Moreover, it is preferable that the plurality of plano-convex lenses be provided by being inset in the plurality of depressed portions.

By a first method for etching a light-transmitting substrate after sealing, the peripheral blur can be prevented, and the light-transmitting substrate can be prevented from being broken in the process of manufacturing photoelectric conversion elements over the light-transmitting substrate.

In addition, since only one of the pair of light-transmitting substrates is etched, the other of the pair of light-transmitting substrates can be left thick; therefore, mechanical strength of the whole device can be maintained even after the etching.

Wet etching is preferably performed in the first method, in which case mechanical damage is not caused.

By a second method for providing a plano-convex lens in the light-transmitting substrate, light in an oblique direction refracted by the plano-convex lens, whereby the peripheral blur can be prevented.

Note that the first method and the second method may be used alone or in combination. When the first and second methods are used in combination, the peripheral blur can be prevented more effectively.

DETAILED DESCRIPTION OF THE INVENTION

Figure 1:
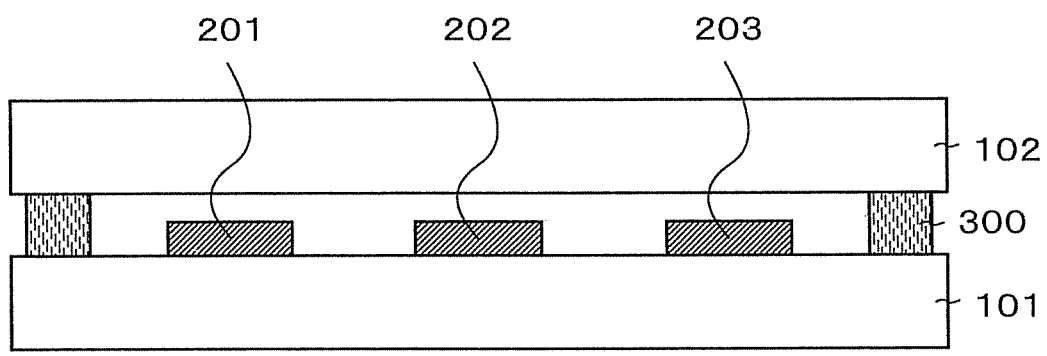
FIG. 1 illustrates an example of a method for manufacturing a semiconductor device.

Embodiments will be described below.

It is easily understood by those skilled in the art that modes and details of the present invention can be modified in various ways without departing from the spirit and scope of the present invention.

Therefore, the present invention should not be interpreted as being limited to what is described in the embodiments described below.

In the structures to be given below, the same portions or portions having similar functions are denoted by the same reference numerals in different drawings, and explanation thereof will not be repeated.

The following embodiments can be combined with each other, as appropriate.

Embodiment 1

An example of a method for performing etching on a light-transmitting substrate after sealing is described with reference to FIG. 1.

First, at least photoelectric conversion elements (such as a photoelectric conversion element 201, a photoelectric conversion element 202, and a photoelectric conversion element 203) are formed over a light-transmitting substrate 101.

Other than the photoelectric conversion elements, a switching element, a display element (such as a liquid crystal display element and an electroluminescent display element), and the like may be formed over the light-transmitting substrate 101.

Note that a base insulating film, an interlayer insulating film, and the like may be provided between the photoelectric conversion elements and the light-transmitting substrate 101.

Next, a light-transmitting substrate 102 is provided so as to face the photoelectric conversion elements, and the photoelectric conversion elements are sealed with a sealant 300.

Note that in the case where the switching element, the display element, and the like are provided, sealing is also performed thereon.

FIG. 1 illustrates a state in which the photoelectric conversion elements are sealed.

After the sealing, etching is performed to reduce the thickness of the light-transmitting substrate 101.

As an etching method, mechanical polishing, CMP (chemical mechanical polishing), wet etching, or the like can be used.

Note that in the case where polishing methods such as mechanical polishing and CMP are used, the light-transmitting substrate 101 is damaged mechanically while polishing, whereby the substrate is broken or the strength of the substrate is reduced in some cases.

Therefore, wet etching by which the substrate is not damaged mechanically is preferably used.

Here, an example of a method using wet etching is described with reference to FIG. 2.

Figure 2:
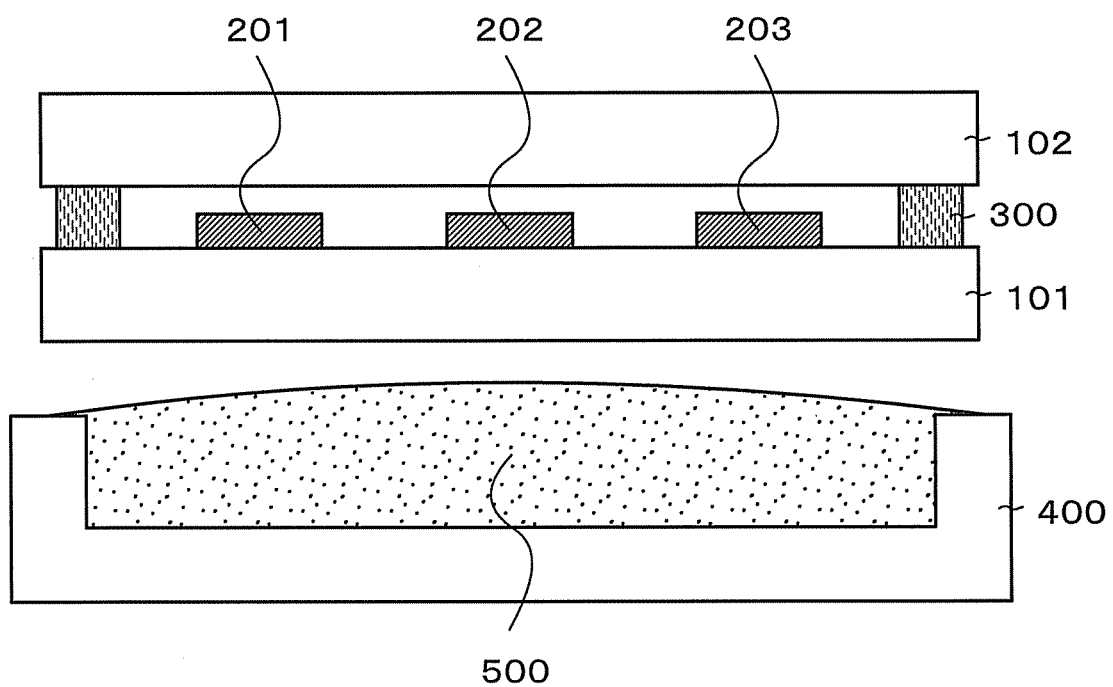
FIG. 2 illustrates an example of a method for manufacturing a semiconductor device.

First, a container 400 is filled with an etchant 500 (see FIG. 2).

The surface of the etchant 500 filling the container 400 is raised higher than the height of the container 400 due to surface tension. Since the size of an opening of the container is smaller than that of the light-transmitting substrate, the light-transmitting substrate can be supported by the edge (peripheral portion) of the container 400. The light-transmitting substrate is supported by the edge of the container 400; therefore, a jig (a substrate holder) to support the light-transmitting substrate is not necessarily provided. Accordingly, the etching becomes simple (see FIG. 2).

Then, when the light-transmitting substrate 101 is placed on the container 400 so that the edge (peripheral portion) of the container 400 overlaps with the edge (peripheral portion) of the light-transmitting substrate 101, the light-transmitting substrate 101 is etched. Thus, only the light-transmitting substrate 101 can be selectively etched by wet etching using the etchant which is raised higher than the height of the container 400 due to surface tension, without etching the light-transmitting substrate 102. When only the light-transmitting substrate 101 is selectively etched and the light-transmitting substrate 102 is not etched, the mechanical strength of the whole device can be maintained, which is preferable. Note that a method in which the light-transmitting substrates 101 and 102 are sunk in the etchant 500 may be used. However, in the case where the light-transmitting substrate 102 is not to be etched, the method in which the light-transmitting substrates 101 and 102 are sunk in the etchant is not preferable. Note that the method in which the light-transmitting substrate 101 is placed on the container 400 so that the edge (peripheral portion) of the container 400 overlap with the edge (peripheral portion) of the light-transmitting substrate 101 is superior in that a sealing material (a sealant) is not invaded by the etchant.

Note that any material can be used for the etchant 500 as long as it can etch the light-transmitting substrate 101.

For example, when a light-transmitting substrate is a glass substrate or the like containing silicon oxide as its main component, hydrofluoric acid or the like may be used as the etchant 500. Note that the light-transmitting substrate with a thickness of greater than or equal to 500 µm (preferably, greater than or equal to 700 µm) has sufficient mechanical strength. After the etching is performed, it is preferable that the thickness of the substrate be less than or equal to 400 µm (preferably, less than or equal to 200 µm). The light-transmitting substrate 102 may be the same as or different from the light-transmitting substrate 101. A glass substrate, a quartz substrate, a plastic substrate or the like can be given as example of the light-transmitting substrate; however, the light-transmitting substrate is not limited thereto.

In the case where only hydrofluoric acid is used as an etchant for etching a glass substrate, the glass substrate get fogged slightly. A solution in which sulfuric acid and hydrofluoric acid are mixed is preferably used, in which case the glass substrate can be prevented from getting fogged.

In addition, any material can be used for the container 400 as long as it is not dissolved, decayed, and the like by the etchant 500.

Figure 3:
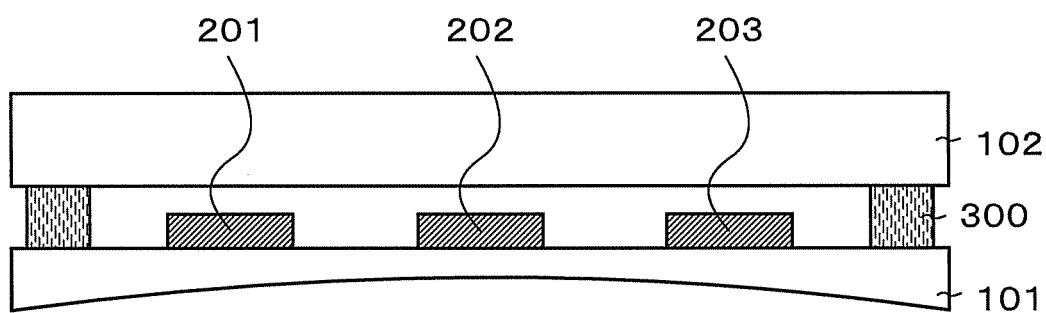
FIG. 3 illustrates an example of a method for manufacturing a semiconductor device.

FIG. 3 illustrates a state after wet etching is performed.

In the case where wet etching is performed using the method as illustrated in FIG. 2, the light-transmitting substrate is etched to have a shape in which the central portion is slightly depressed as illustrated FIG. 3 since the central portion of the light-transmitting substrate is easily etched. However, the wet etching is preferable because the substrate can be thinned without being damaged mechanically.

This embodiment can be combined with all the other embodiments.

Embodiment 2

Figure 13A:
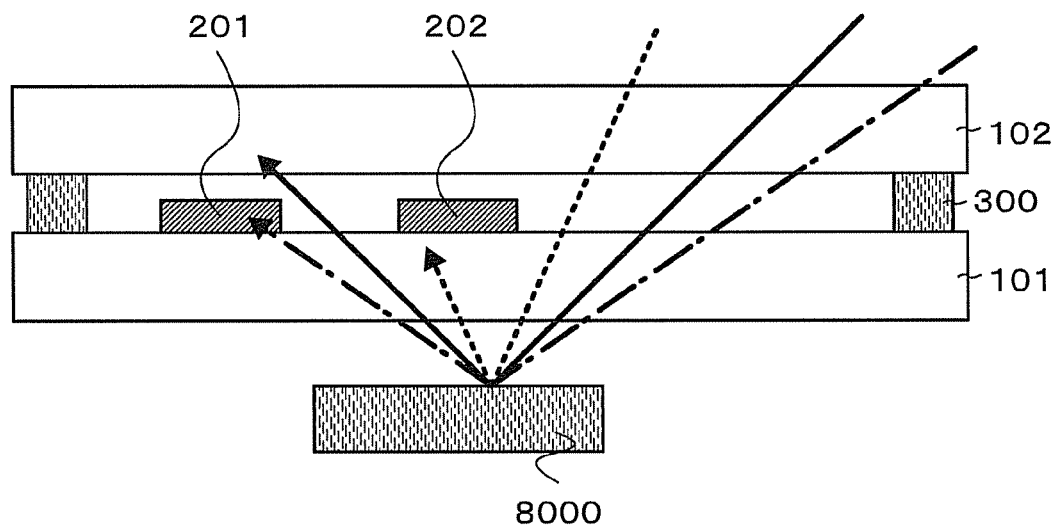
FIGS. 13A and 13B illustrate examples of reflected light.
Figure 13B:
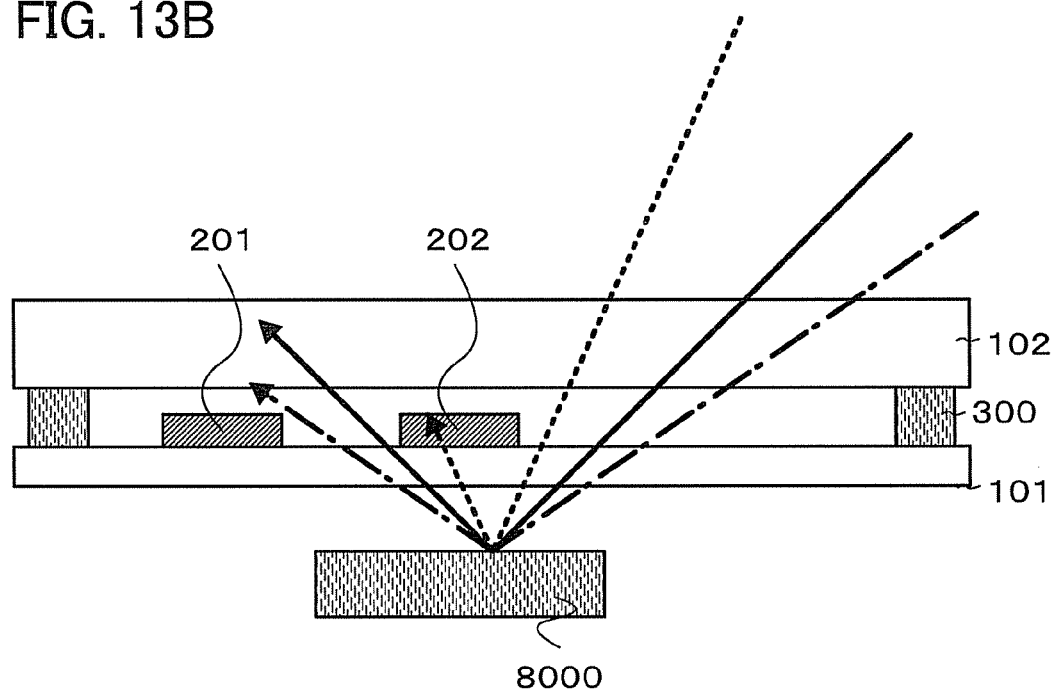
Figure 14:
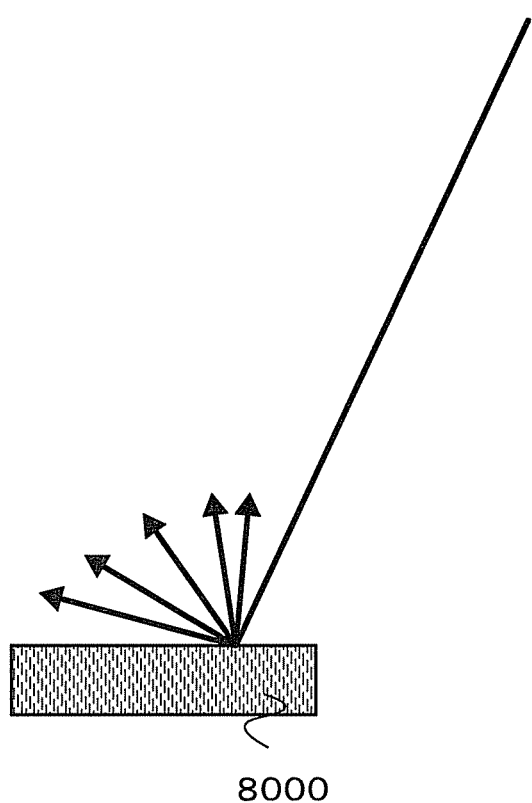
FIG. 14 illustrates an example of reflected light.

An effect of thinning a light-transmitting substrate is described in FIGS. 13A, 13B and FIG. 14.

FIG. 13A corresponds to FIG. 1.

FIG. 13B corresponds to a view illustrating a case where the light-transmitting substrate 101 is thinned in FIG. 1.

In FIGS. 13A and 13B, a dotted arrow, a solid arrow, and a dashed-and-dotted line arrow each denote light.

Note that the distance between the light-transmitting substrate 101 and an object to be read 8000 in FIG. 13A is the same as that of FIG. 13B.

As for reflected light of light (denoted by the dotted arrow, the solid arrow, and the dashed-and-dotted line arrow) incident on the object to be read 8000 from a variety of angles, light denoted by the dashed-and-dotted line arrow enters a photoelectric conversion element 201 next to the photoelectric conversion element 202 in FIG. 13A.

On the other hand, light denoted by the dashed-and-dotted line arrow does not enter the photoelectric conversion element 201 in FIG. 13B.

Thus, in FIG. 13B, the distance between a photoelectric conversion element 202 and the object to be read 8000 can be shortened by reducing the thickness of the light-transmitting substrate 101, whereby the amount of reflected light which enters the photoelectric conversion element 201 next to the photoelectric conversion element 202 can be reduced.

Although an example of specular reflection (mirror reflection) light is described in FIGS. 13A and 13B, light reflects diffusely off a textured surface, for example paper, a finger, and the like, as illustrated in FIG. 14.

Further, even in the case where diffuse reflection occurs as illustrated in FIG. 14, the distance between the photoelectric conversion element 202 and the object to be read 8000 can be shortened by reducing the thickness of the light-transmitting substrate 101, whereby the amount of reflected light which enters the photoelectric conversion element 201 next to the photoelectric conversion element 202 can be reduced.

This embodiment can be combined with all the other embodiments.

Embodiment 3

An example of a semiconductor device having a photoelectric conversion element will be described.

Figure 4:
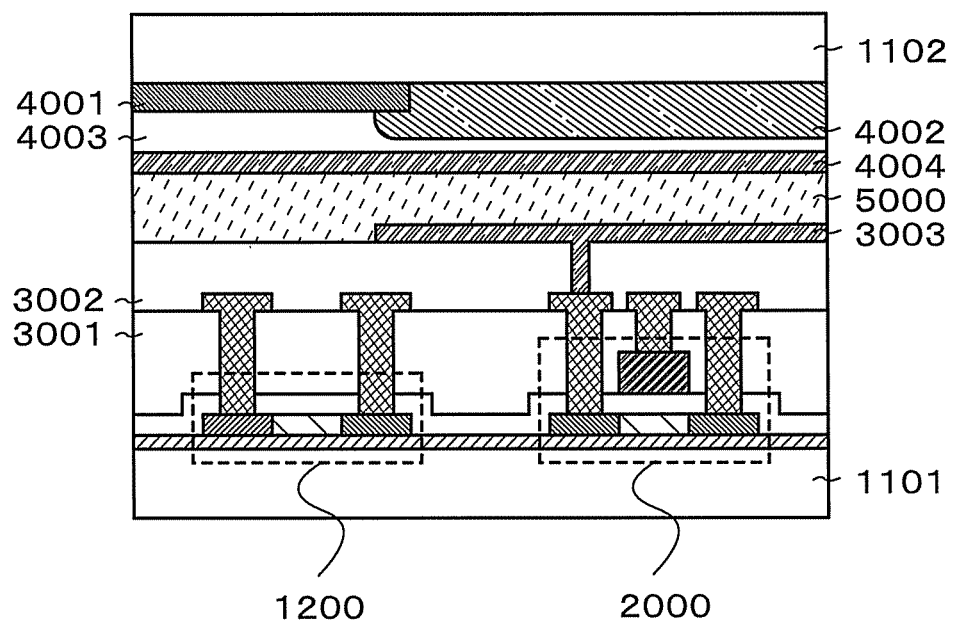
FIG. 4 illustrates an example of a semiconductor device.

In FIG. 4, a base insulating film is formed over a light-transmitting substrate 1101; a photoelectric conversion element 1200 and a switching element 2000 are provided over the base insulating film; an interlayer insulating film 3001 is provided over the photoelectric conversion element 1200 and the switching element 2000; a plurality of wirings which are electrically connected to the photoelectric conversion element 1200 and the switching element 2000 are provided over the interlayer insulating film 3001; an interlayer insulating film 3002 is provided over the plurality of wirings; an pixel electrode 3003 which is electrically connected to the switching element 2000 through the wiring is provided over the interlayer insulating film 3002; a liquid crystal 5000 is provided over the pixel electrode 3003; a counter electrode 4004 is formed over the liquid crystal 5000; an overcoat film 4003 is provided over the counter electrode 4004; a light-blocking layer 4001 and a colored layer 4002 are provided over the overcoat film 4003; and a light-transmitting substrate 1102 is provided over the light-blocking layer 4001 and the colored layer 4002.

Note that the light-blocking layer 4001, the colored layer 4002, the overcoat film 4003, and the counter electrode 4004 are formed in this order over the light-transmitting substrate 1102. Although an example of a liquid crystal display element is described in this embodiment, an electroluminescent element may alternatively be used.

In FIG. 4, the photoelectric conversion element 1200 is a PIN photodiode which is arranged in a direction parallel to a surface of the light-transmitting substrate 1101, and formed in the same step (the same material) as a semiconductor layer of the switching element 2000.

Note that although any semiconductor layer can be used, a single crystal semiconductor is preferably used, in which case the size of the PIN photodiode can be reduced and an aperture ratio of a display element can be increased.

Figure 15:
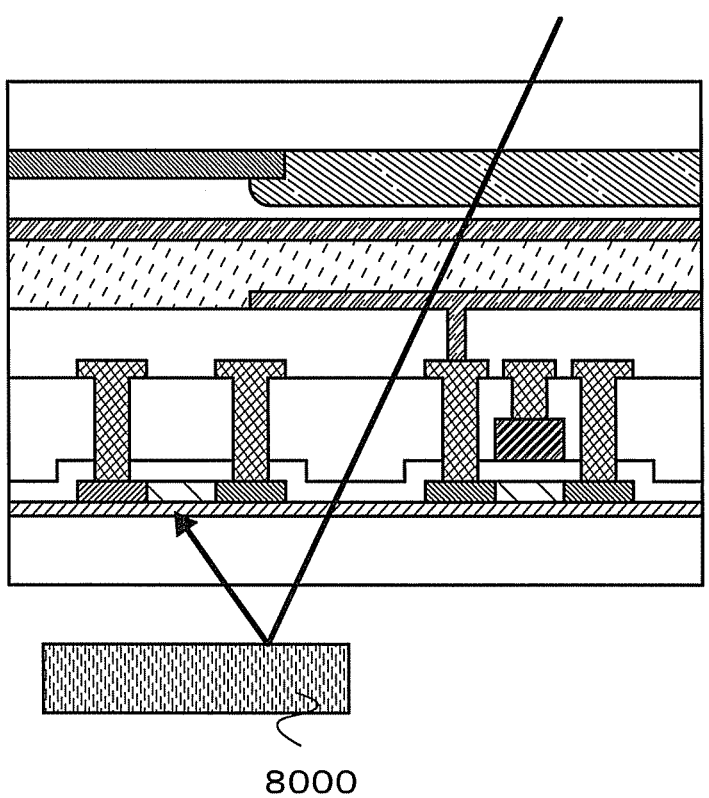
FIG. 15 illustrates an example of reflected light.

In the case of employing the structure illustrated in FIG. 4, light from a backlight provided over the light-transmitting substrate 1102 is transmitted through a space between the switching elements, reflects off the object to be read 8000, and reaches the photoelectric conversion element 1200 (see FIG. 15).

Figure 5:
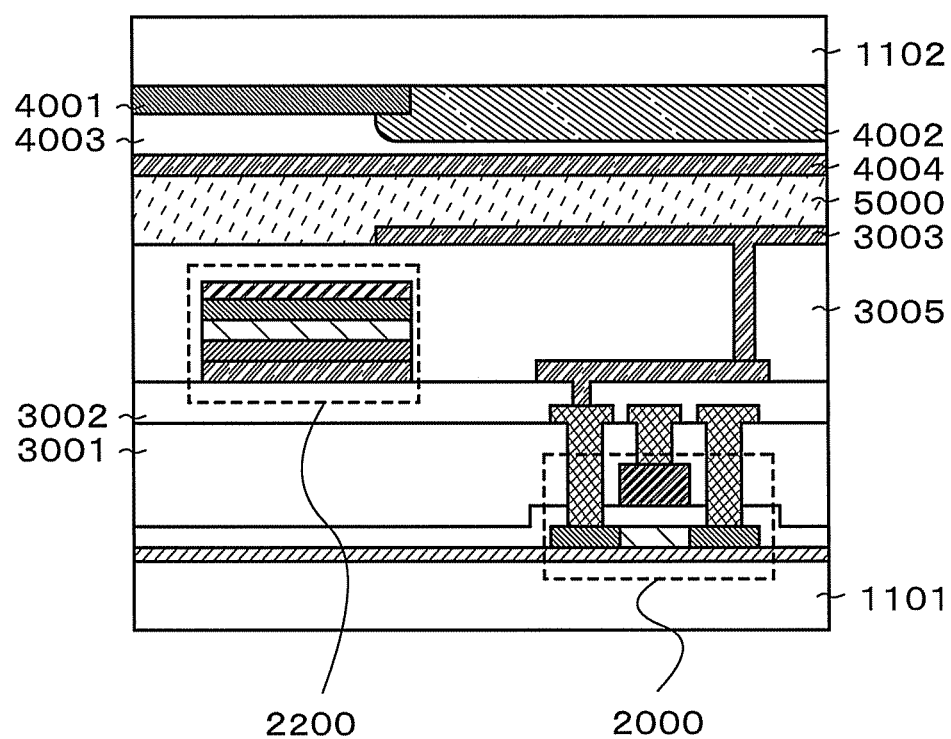
FIG. 5 illustrates an example of a semiconductor device.

Although an example in which the switching element and the photodiode are formed over the same insulating substrate is described in FIG. 4, the photodiode may be arranged in an upper portion of the switching element as illustrated in FIG. 5. Alternatively, the photodiode may be arranged in a lower portion of the switching element.

Note that FIG. 5 illustrates the case where the photoelectric conversion element 2200 is provided over the interlayer insulating film 3002 and an interlayer insulating film 3005 is added over the photoelectric conversion element 2200.

This embodiment can be combined with all the other embodiments.

Embodiment 4

As described with reference to FIG. 2 and FIG. 3, in the case where the light-transmitting substrate is etched by wet etching, the central portion of the light-transmitting substrate is etched to have a depressed shape (which is referred to as a depressed portion below).

Figure 6:
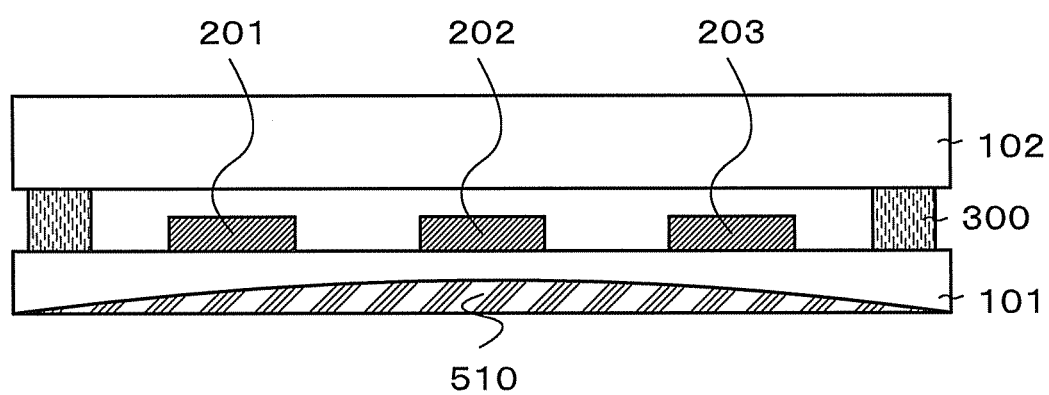
FIG. 6 illustrates an example of a semiconductor device.

Then, a plano-convex lens can be formed by filling the depressed portion with a resin 510 as illustrated in FIG. 6.

In other words, after sealing a plurality of photoelectric conversion elements with the light-transmitting substrate 101, over which the plurality of photoelectric conversion elements are formed, the light-transmitting substrate 102, and a sealant, the light-transmitting substrate 101 is etched by wet etching, and the depressed portion formed by the wet etching is filled with the resin 510.

As the resin 510, siloxane polymer, acrylic, an epoxy resin, polyimide, or the like can be used.

Note that a plano-convex lens may be inset in the depressed portion in stead of filling the depressed portion with the resin 510.

In other words, after sealing the plurality of photoelectric conversion elements with the light-transmitting substrate 101, over which the plurality of photoelectric conversion elements are formed, the light-transmitting substrate 102, and a sealant, the light-transmitting substrate 101 is etched by wet etching, and the plano-convex lens is inset in the depressed portion formed by the wet etching.

Note that it is preferable that rough polishing be performed on the light-transmitting substrate 101 immediately after wet etching is performed, and a curved surface of the depressed portion is adjusted by mirror polishing after the rough polishing is performed.

The rough polishing is a process in which the depressed portion is polished to have an approximate radius of curvature, an approximate shape, and an approximate size. The rough polishing may be performed by a curve generator to which an artificial diamond tool is attached, or the like.

In addition, the mirror polishing is a finishing process in which the surface of the depressed portion is polished to be smooth.

By forming a curved surface by wet etching in advance, the processing time of the rough polishing can be shortened. Accordingly, mechanical damage on the substrate can be reduced by reducing the processing time of the rough polishing, since the rough polishing is mechanical polishing.

In the case where the curved surface is formed using a raised portion of an etchant, which is due to surface tension, as illustrated in FIG. 2, a radius of curvature can be adjusted to be increased by adding a surface active agent to the etchant.

When the surface active agent is added, the surface tension is reduced and the raised portion of the etchant becomes smaller. As the surface active agent, a known surface active agent may be selected in accordance with the kind of etchant.

Figure 7:
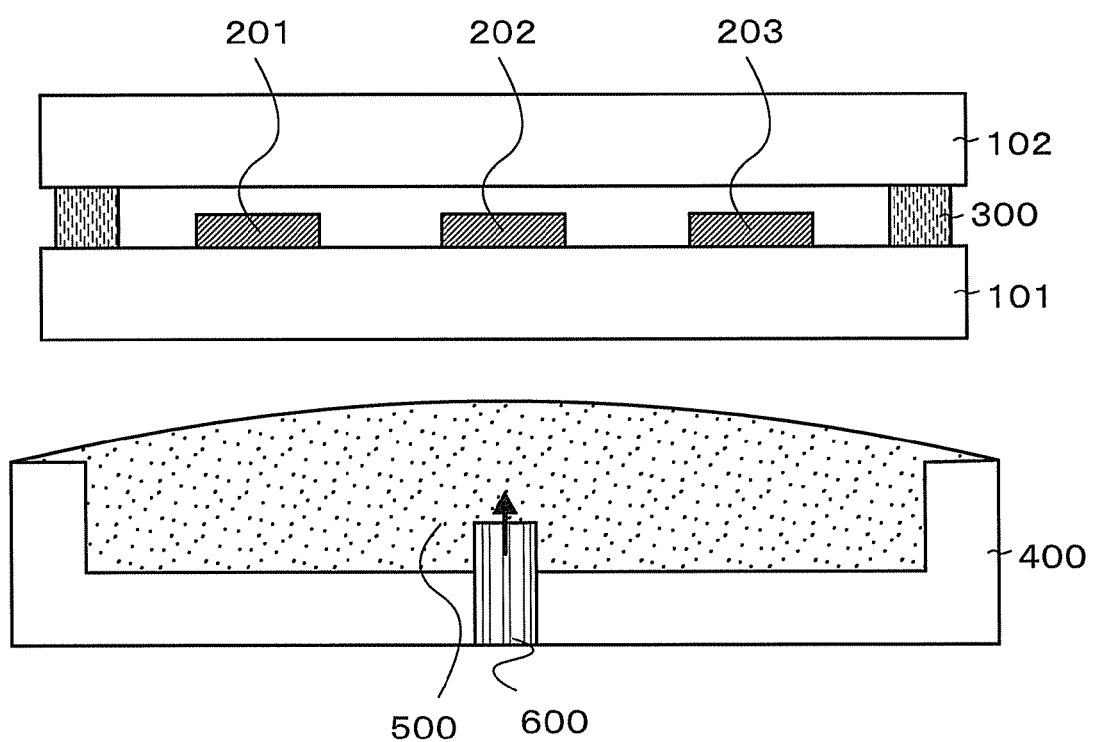
FIG. 7 illustrates an example of a method for manufacturing a semiconductor device.

On the other hand, in order to reduce the radius of curvature, it is preferable that a method for supplying an etchant from the central portion of a container as illustrated in FIG. 7 be used.

In FIG. 7, a tube 600 by which an etchant is supplied is attached to the bottom of a container 400.

Then, an etchant is supplied from the tube 600, and flows from the central portion toward the peripheral portion of the container 400, whereby a surface of the etchant is raised.

A generally desired radius of curvature can be obtained by only adjusting the flow rate of the etchant supplied from the tube 600.

This embodiment can be combined with all the other embodiments.

Embodiment 5

Although the structure in which one large plano-convex lens is provided is illustrated in FIG. 6, a structure in which a plurality of plano-convex lenses are provided so as to overlap with a plurality of photoelectric conversion elements may be employed.

Figure 8:
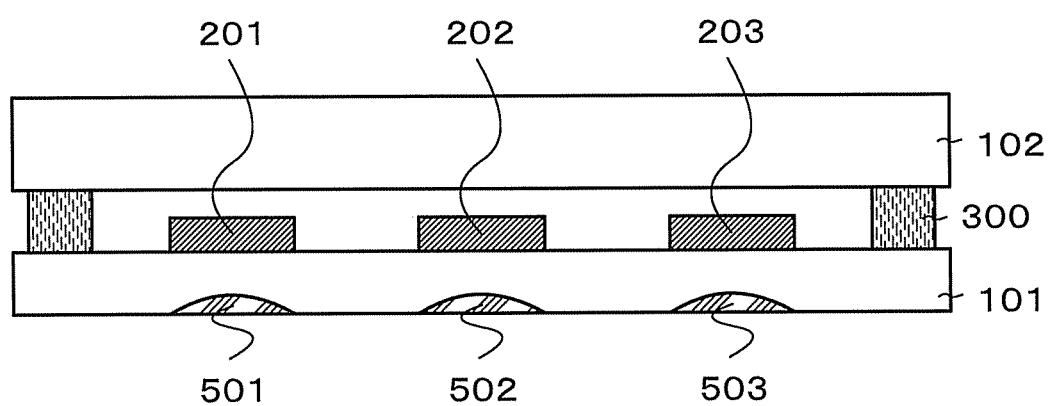
FIG. 8 illustrates an example of a semiconductor device.

In FIG. 8, plano-convex lenses made of resins 501, 502, and 503 are provided so as to overlap with photoelectric conversion elements 201, 202, and 203, respectively. Note that although an example in which a photoelectric conversion element corresponds to a plano-convex lens is described in this embodiment mode, a structure in which a plurality of photoelectric conversion elements correspond a plano-convex lens may be employed. For example, in the case where 10 lenses and 100 photoelectric conversion elements are provided, each of the lenses may be arranged so as to overlap with 10 photoelectric conversion elements.

The plano-convex lenses may be formed by selectively etching the light-transmitting substrate 101 to form a plurality of depressed portions after sealing is performed, and filling the plurality of depressed portions with the resins.

Alternatively, the plurality of plano-convex lenses may be inset in the plurality of depressed portions.

Note that it is preferable that rough polishing be performed on the light-transmitting substrate 101 immediately after wet etching is performed, and a curved surface of the depressed portion is adjusted by mirror polishing after the rough polishing is performed.

The rough polishing is a process in which the depressed portion is polished to have an approximate radius of curvature, an approximate shape, and an approximate size. The rough polishing may be performed by a curve generator to which an artificial diamond tool is attached, or the like.

In addition, the mirror polishing is a finishing process in which the surface of the depressed portion is polished to be smooth.

By forming a curved surface by wet etching in advance, the processing time of the rough polishing can be shortened. Accordingly, mechanical damage on the substrate can be reduced by reducing the processing time of the rough polishing, since the rough polishing is a mechanical polishing.

A method for manufacturing the plurality of depressed portions will be described.

Figure 9:
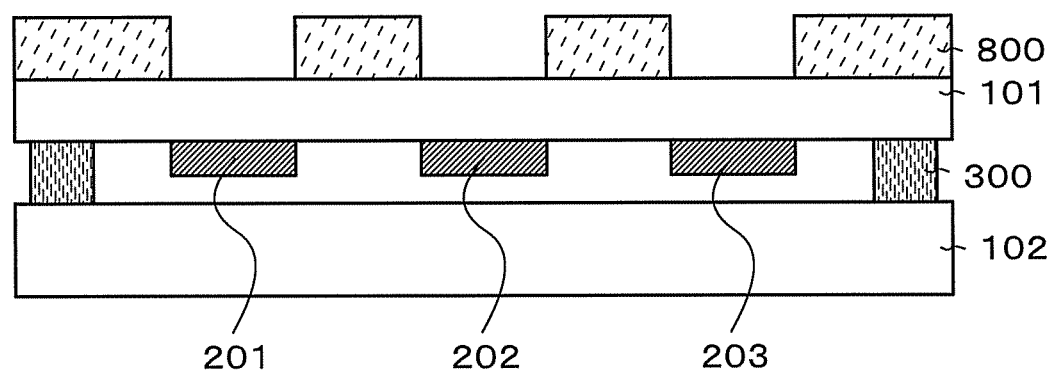
FIG. 9 illustrates an example of a method for manufacturing a semiconductor device.

For example, as illustrated in FIG. 9, a mask 800 having a plurality of openings, which are provided in positions corresponding to those of the plurality of photoelectric conversion elements, is formed and the light-transmitting substrate 101 is etched using the mask 800 by wet etching.

Since wet etching is isotropic etching, a depressed portion having a curved surface can be formed.

Figure 10:
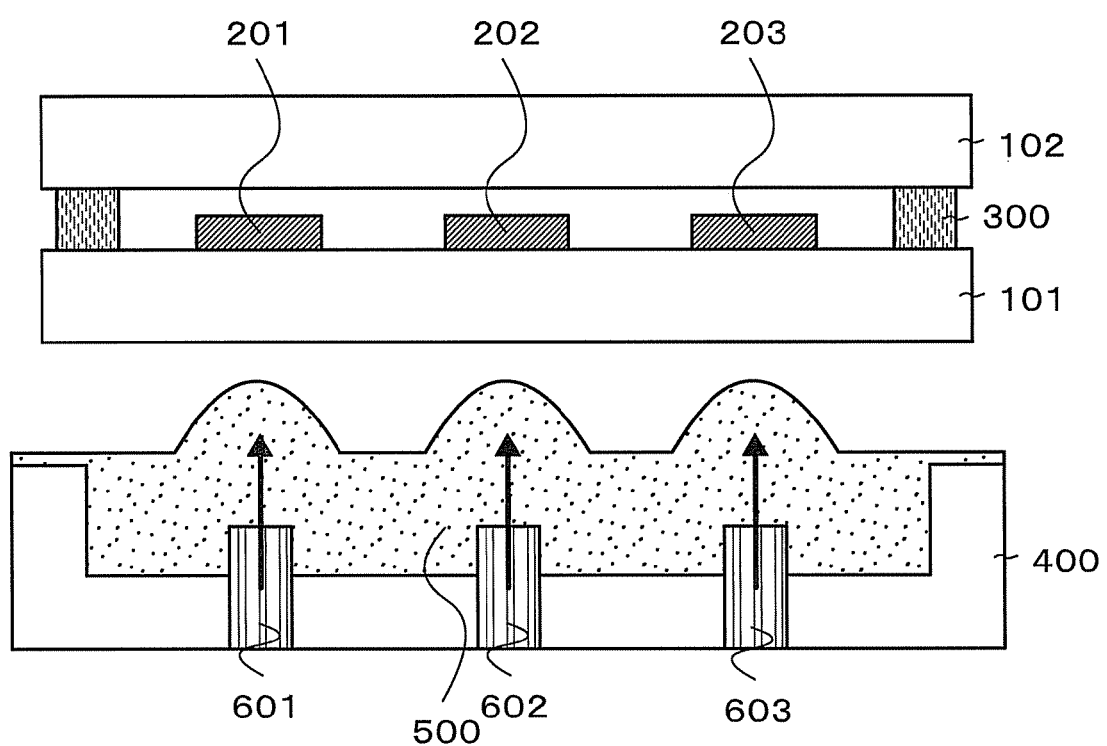
FIG. 10 illustrates an example of a method for manufacturing a semiconductor device.

For example, an etching apparatus as illustrated in FIG. 10 may be used.

In FIG. 10, an etching apparatus has a structure in which a plurality of tubes (tubes 601, 602, and 603) are arranged at a bottom of the container 400.

The plurality of tubes are provided in positions corresponding to those of the plurality of photoelectric conversion elements.

In a manner similar to the tube 600 in FIG. 7, an etchant can be supplied from the plurality of tubes (tubes 601, 602, and 603).

By supplying a larger flow rate of etchant than that in FIG. 7 from the tube, etchant can be ejected from surface of etchant on the basis of a mechanism of fountain (see FIG. 10). That is, the flow rate may be reduced so that an etchant flows from a central portion toward a peripheral portion in FIG. 7, and may be increased so that the surface of the etchant is locally raised on the basis of the mechanism of fountain in FIG. 10.

Then, the light-transmitting substrate 101 can be selectively etched by being made in contact with the ejected etchant.

Note that the light-transmitting substrate 101 is preferably made in contact with the surface of the etchant, in which case depressed portions are formed in positions overlapping with the tubes and portions not overlapping with the tubes are etched at the same time, and thus the depressed portions can be formed while reducing the thickness of the light-transmitting substrate 101.

Here, in order to reduce the area of the depressed portions, the size of the tubes may be reduced in FIG. 10.

However, there is a problem in that the tube is easily clogged when the size thereof is reduced.

Figure 11:
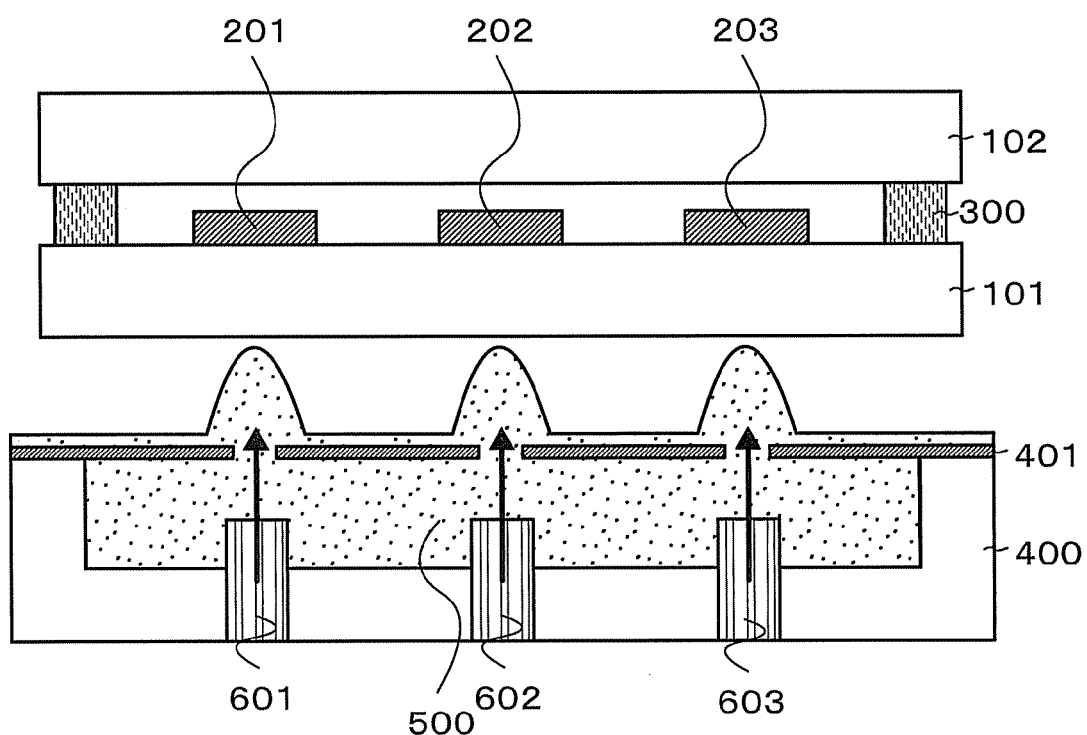
FIG. 11 illustrates an example of a method for manufacturing a semiconductor device.
Figure 12:
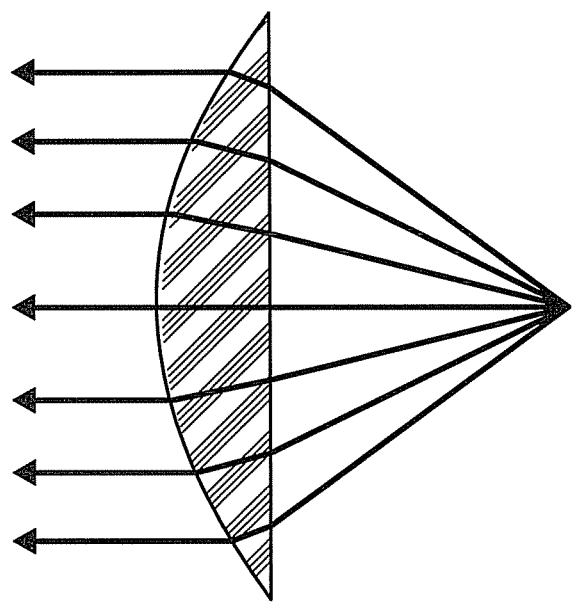
FIG. 12 illustrates an example of a plano-convex lens.

Therefore, as illustrated in FIG. 11, a cover 401 having a plurality of openings is provided over the container 400, so that the area of the depressed portions can be reduced without reducing the size of the tubes.

Note that the area of the opening of the cover 401 is smaller than that of an outlet of the tube in FIG. 11.

The cover is detachable and easily cleaned, may be disposable, and can be thinned; therefore, there is no need to worry about clogging of the openings of the cover.

Note that the ejected etchant drops and flows on the cover (see FIG. 11).

Then, by processing an upper surface of the cover into a porous shape, a part of the dropped etchant can be absorbed; therefore, the etchant dropped on the cover can be prevented from splashing, adhering to the light-transmitting substrate, and corroding the light-transmitting substrate.

Note that an effect similar to the above can be obtained even by arranging a sponge on the upper surface of the cover.

Here, in FIG. 11, the light-transmitting substrate 101 is preferably made in contact with etchant on the surface of the cover, in which case depressed portions are formed in positions overlapping with the tubes and portions not overlapping with the tubes are etched at the same time; and thus the depressed portions can be formed while reducing the thickness of the substrate.

In the case where the light-transmitting substrate 101 is made in contact with etchant on the surface of the cover, uniform etching can be performed by making the surface of the cover 401 hydrophilic so that the etchant is uniformly spread over the surface of the cover.

Note that in order to make the surface of the cover 401 hydrophilic, the surface of the cover 401 may be covered with hydrophilic material, or a hydrophilic material may be used as the material of the cover 401.

This embodiment can be combined with all the other embodiments.

Embodiment 6

An example of a writing board (such as a blackboard and a whiteboard) using a panel having an optical sensor will be described.

Figure 16:
FIG. 16 illustrates an example of a writing board.

For example, a panel 9696 having an optical sensor is provided in FIG. 16.

The panel 9696 has an optical sensor and a display element.

Here, it is possible to freely write with a marker and the like on the surface of the panel 9696.

Text can be erased easily with a marker or the like which does not contain a fixing agent.

In addition, it is preferable that the surface of the panel 9696 have sufficient smoothness so that ink of a marker is easily erased.

For example, the surface of the panel 9696 has sufficient smoothness when a glass substrate or the like is used for the surface of the panel 9696.

Alternatively, a transparent synthetic resin sheet or the like may be attached to the surface of the panel 9696.

As the synthetic resin, acrylic or the like is preferably used. In this case, it is preferable to make the surface of the synthetic resin smooth.

Since the panel 9696 has the display element, a particular image can be displayed on the panel 9696 and something can be written with the marker over the surface of the panel 9696.

In addition, since the panel 9696 has the optical sensor, text written with the marker can be read and printed by connecting the panel 9696 to a printer or the like.

Further, since the panel 9696 has the optical sensor and the display element, by writing text, creating drawings, or the like on the surface of the panel 9696 with an image displayed, a trail of the marker read by the optical sensor and the image can be synthesized and displayed on the panel 9696.

Note that sensing with a resistive sensing method, a capacitive sensing method, or the like can be performed only at the same time as writing with a marker or the like.

On the other hand, sensing with an optical sensor is superior in that sensing can be performed anytime after something is written with a marker or the like, even if time has passed.

Although an example of a writing board is described in this embodiment, a panel having an optical sensor can be applied to other electronic devices.

As examples of the electronic devices, a television, a display of a personal computer, a display device for advertising, a game machine, an automated teller machine, an automatic ticket vending machine, and the like can be given; however the electronic devices are not limited thereto.

This embodiment can be freely combined with all the other embodiments.

This application is based on Japanese Patent Application serial no. 2009-193264 with Japan Patent Office on Aug. 24, 2009, the entire contents of which are hereby incorporated by reference.

What is claimed is:

1. A method for manufacturing a semiconductor device, comprising the steps of:
   forming a plurality of photoelectric conversion elements over a first light-transmitting substrate;
   providing a second light-transmitting substrate so as to face the plurality of photoelectric conversion elements;
   bonding the first light-transmitting substrate and the second light-transmitting substrate by a sealant, the sealant surrounding the plurality of photoelectric conversion elements; and
   thinning the first light-transmitting substrate by wet etching.

2. A method for manufacturing a semiconductor device, comprising the steps of:
   forming a plurality of photoelectric conversion elements over a first light-transmitting substrate;
   providing a second light-transmitting substrate so as to face the plurality of photoelectric conversion elements;
   bonding the first light-transmitting substrate and the second light-transmitting substrate by a sealant, the sealant surrounding the plurality of photoelectric conversion elements;
   thinning the first light-transmitting substrate thereby forming a depressed portion at a bottom surface of the first light-transmitting substrate by wet etching; and
   providing a plano-convex lens at the depressed portion.

3. The method for manufacturing a semiconductor device according to claim 2, wherein the plano-convex lens is formed by filling the depressed portion with a resin.

4. The method for manufacturing a semiconductor device according to claim 2, wherein the plano-convex lens is provided by being inset in the depressed portion.

5. A method for manufacturing a semiconductor device, comprising the steps of:
   forming a plurality of photoelectric conversion elements over a first light-transmitting substrate;
   providing a second light-transmitting substrate so as to face the plurality of photoelectric conversion elements;
   bonding the first light-transmitting substrate and the second light-transmitting substrate by a sealant, the sealant surrounding the plurality of photoelectric conversion elements;
   thinning the first light-transmitting substrate thereby forming one or more depressed portions at a bottom surface of the first light-transmitting substrate by wet etching; and
   providing one or more plano-convex lenses so as to correspond to the plurality of depressed portions.

6. The method for manufacturing a semiconductor device according to claim 5, wherein the plurality of plano-convex lenses are formed by filling the plurality of depressed portions with a resin.

7. The method for manufacturing a semiconductor device according to claim 5, wherein the plurality of plano-convex lenses are provided by being inset in the plurality of depressed portions.

8. The method for manufacturing a semiconductor device according to claim 1, wherein a depressed portion is formed at a bottom surface of the first light-transmitting substrate by the wet etching.

9. The method for manufacturing a semiconductor device according to claim 1, wherein one or more depressed portions are formed at a bottom surface of the first light-transmitting substrate by the wet etching.

10. The method for manufacturing a semiconductor device according to claim 1, wherein the wet etching is performed by steps of:
    preparing a container filled with an etchant, wherein a surface of the etchant filling the container is raised higher than the height of the container due to surface tension; and
    placing the light-transmitting substrate on the container so that edge of the container overlaps with edge of the light-transmitting substrate.

11. The method for manufacturing a semiconductor device according to claim 10, wherein an area of an opening of the container is smaller than that of the light-transmitting substrate.

12. The method for manufacturing a semiconductor device according to claim 10, wherein the light-transmitting substrate is supported by the edge of the container.

13. The method for manufacturing a semiconductor device according to claim 2, wherein the wet etching is performed by steps of:
    preparing a container filled with an etchant, wherein a surface of the etchant filling the container is raised higher than the height of the container due to surface tension; and
    placing the light-transmitting substrate on the container so that edge of the container overlaps with edge of the light-transmitting substrate.

14. The method for manufacturing a semiconductor device according to claim 13, wherein an area of an opening of the container is smaller than that of the light-transmitting substrate.

15. The method for manufacturing a semiconductor device according to claim 13, wherein the light-transmitting substrate is supported by the edge of the container.

16. The method for manufacturing a semiconductor device according to claim 5, wherein the wet etching is performed by steps of:
    preparing a container filled with an etchant, wherein a surface of the etchant filling the container is raised higher than the height of the container due to surface tension; and
    placing the light-transmitting substrate on the container so that edge of the container overlaps with edge of the light-transmitting substrate.

17. The method for manufacturing a semiconductor device according to claim 16, wherein an area of an opening of the container is smaller than that of the light-transmitting substrate.

18. The method for manufacturing a semiconductor device according to claim 16, wherein the light-transmitting substrate is supported by the edge of the container.

* * * * *